(12) United States Patent
Huang et al.

(10) Patent No.: US 9,881,889 B2
(45) Date of Patent: Jan. 30, 2018

(54) CHIP PACKAGE AND METHOD FOR FABRICATING THE SAME

(71) Applicant: XINTEC INC., Jhongli, Taoyuan County (TW)

(72) Inventors: Yu-Lung Huang, Daxi Township (TW); Shu-Ming Chang, New Taipei (TW); Tsang-Yu Liu, Zhubei (TW); Yen-Shih Ho, Kaohsiung (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/251,470

(22) Filed: Apr. 11, 2014

(65) Prior Publication Data

US 2014/0306343 A1    Oct. 16, 2014

Related U.S. Application Data

(60) Provisional application No. 61/811,487, filed on Apr. 12, 2013.

(51) Int. Cl.
*H01L 23/48*     (2006.01)
*H01L 23/00*     (2006.01)
(Continued)

(52) U.S. Cl.
CPC .............. *H01L 24/14* (2013.01); *H01L 21/78* (2013.01); *H01L 22/12* (2013.01); *H01L 22/20* (2013.01); *H01L 24/16* (2013.01); *H01L 24/17* (2013.01); *H01L 24/81* (2013.01); *H01L 24/92* (2013.01); *H01L 24/94* (2013.01); *H01L 24/11* (2013.01); *H01L 24/13* (2013.01); *H01L 24/97* (2013.01); *H01L 2224/11334* (2013.01); *H01L 2224/131* (2013.01); *H01L 2224/1403* (2013.01); *H01L 2224/14131* (2013.01); *H01L 2224/14145* (2013.01); *H01L 2224/14177* (2013.01); *H01L 2224/14179* (2013.01); *H01L 2224/16058* (2013.01); *H01L 2224/16227* (2013.01);
(Continued)

(58) Field of Classification Search
CPC ......... H01L 22/20; H01L 21/78; H01L 24/14; H01L 24/07; H01L 24/11; H01L 22/12; H01L 24/13; H01L 2224/0401; H01L 24/81; H01L 24/12; H01L 2225/06513; H01L 2224/81; H01L 2224/1043; H01L 24/16; H01L 2224/16227; H01L 2224/16237
USPC ......... 257/737, 738, 778, E21.508, E23.021, 257/E23.069; 438/108, 613
See application file for complete search history.

(56) References Cited

U.S. PATENT DOCUMENTS 5,569,960 A * 10/1996 Kumazawa ......... H01L 23/3128
                                                           257/738
2001/0046832 A1* 11/2001 Hembree ............... B24B 7/22
                                                            451/50
(Continued)

FOREIGN PATENT DOCUMENTS

CN         102214627        10/2011

*Primary Examiner* — Khiem D Nguyen
(74) *Attorney, Agent, or Firm* — Liu & Liu

(57) ABSTRACT

A chip package is provided, in which includes: a packaging substrate, a chip and a plurality solder balls interposed between the packaging substrate and the chip for bonding the packaging substrate and the chip, wherein the solder balls include a first portion of a first size and a second portion of a second size that is different from the first size.

18 Claims, 6 Drawing Sheets

(51) Int. Cl.
 *H01L 21/78* (2006.01)
 *H01L 21/66* (2006.01)
(52) U.S. Cl.
 CPC ........... *H01L 2224/17051* (2013.01); *H01L 2224/17517* (2013.01); *H01L 2224/17519* (2013.01); *H01L 2224/81191* (2013.01); *H01L 2224/81815* (2013.01); *H01L 2224/81986* (2013.01); *H01L 2224/92* (2013.01); *H01L 2224/94* (2013.01); *H01L 2224/97* (2013.01); *H01L 2924/01322* (2013.01); *H01L 2924/13091* (2013.01); *H01L 2924/1461* (2013.01); *H01L 2924/3511* (2013.01)

(56) References Cited

U.S. PATENT DOCUMENTS

| | | | | |
|---|---|---|---|---|
| 2002/0104874 A1* | 8/2002 | Byun | H01L 23/49816 | 228/180.22 |
| 2003/0218261 A1* | 11/2003 | Capote | B23K 35/025 | 257/787 |
| 2004/0130342 A1* | 7/2004 | Akram | | 324/754 |
| 2005/0104222 A1* | 5/2005 | Jeong | H01L 23/16 | 257/778 |
| 2007/0234563 A1* | 10/2007 | Sakaguchi et al. | | 29/843 |
| 2008/0157345 A1* | 7/2008 | Lu | H01L 21/4878 | 257/712 |
| 2009/0267213 A1* | 10/2009 | Lin | H01L 23/49816 | 257/687 |
| 2011/0037156 A1* | 2/2011 | Chandrasekaran | H01L 23/3128 | 257/686 |
| 2011/0057284 A1* | 3/2011 | Brodie | H01L 27/14618 | 257/459 |
| 2011/0248398 A1* | 10/2011 | Parvarandeh | H01L 24/06 | 257/737 |
| 2012/0038061 A1* | 2/2012 | Su | H01L 23/49816 | 257/777 |
| 2013/0026630 A1* | 1/2013 | Low | H01L 23/49811 | 257/738 |
| 2014/0138823 A1* | 5/2014 | Zhang | H01L 22/12 | 257/738 |
| 2014/0175644 A1* | 6/2014 | Srinivasan, Sr. | H01L 24/81 | 257/738 |

* cited by examiner

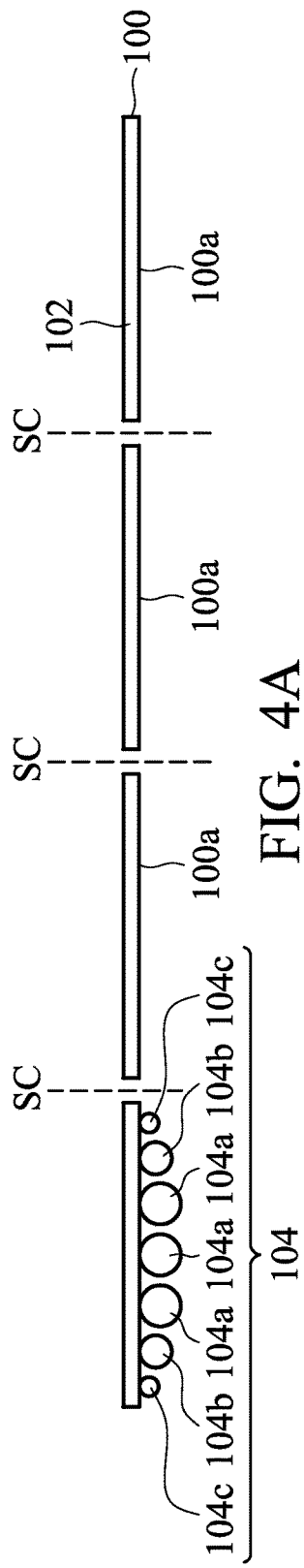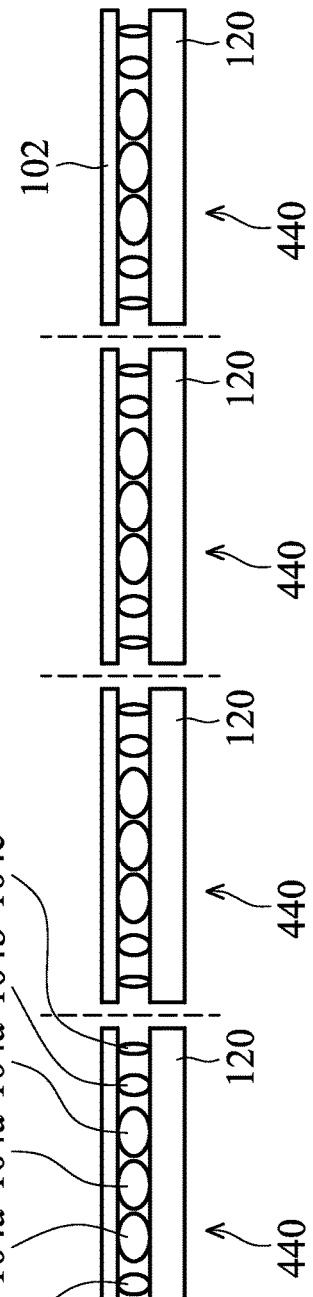
FIG. 4A
FIG. 4B

CHIP PACKAGE AND METHOD FOR FABRICATING THE SAME

CROSS REFERENCE TO RELATED APPLICATIONS

This Application claims the benefit of U.S. Provisional Application No. 61/811,487, filed on Apr. 12, 2013, the entirety of which is incorporated by reference herein.

BACKGROUND OF THE INVENTION

Field of the Invention

The invention relates to a semiconductor device, and in particular relates to a chip package and fabrication method thereof.

Description of the Related Art

The chip packaging process is an important process when fabricating an electronic product. Chip packages not only provide chips with protection from environmental contaminants, but also provide an interface for connection between electronic elements in the chips and electronic elements outside of the chip package.

Due to reductions in the size of electronic products, forming chip packages with more functions and smaller sizes has become an important issue. However, chip packages with more functions and smaller sizes have high-density circuits, which results in a large chip warpage and can lead to some of the solder balls on the chip not being able to bond to a packaging substrate. Therefore, the durability of such chip packages is low, and the performance of the chips is impacted.

BRIEF SUMMARY OF THE INVENTION

Embodiments of the invention provide a chip package, including: a packaging substrate; a chip; and solder balls disposed between the packaging substrate and the chip so as to bond the chip onto the packaging substrate, wherein the solder balls have a first size and a second size that is different from the first size.

Embodiments of the invention provide a manufacturing method of a chip package, including: forming a plurality of chips on a wafer; measuring distribution of a circuit of the chips on the wafer; disposing a plurality of solder balls on the chips on the wafer, wherein the solder balls have a first size and a second size, and the solder balls of the first size and the solder balls of the second size are arranged according to the measurement result; bonding the wafer onto a packaging substrate; and dicing the wafer to form a plurality of chip packages.

Embodiments of the invention provide a manufacturing method of a chip package, including: forming a plurality of chips on a wafer; measuring warpage of the chips on the wafer; dicing the wafer into a plurality of separated chips; disposing a plurality of solder balls on the separated chips, wherein the solder balls have a first size and a second size, and the solder balls of the first size and the solder balls of the second size are arranged according to the measurement result of the warpage; and bonding the separated chips onto corresponding packaging substrates.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 4A-4B are cross-sectional views of a chip-level packaging process of a chip package according to one embodiment of the invention.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It should be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a proximity sensor, but the application is not limited thereto. The wafer scale packaging process mentioned above mainly means that after the packaging process is accomplished during the wafer stage, the wafer with chips is cut to independent packages. However, in a specific embodiment, separated chips may be redistributed overlying a supporting wafer and then be packaged, which may also be referred to as a wafer scale packaging process. In addition, the above mentioned wafer scale packaging process may also be adapted to form chip packages of multi-layer integrated circuit devices by stacking a plurality of wafers having integrated circuits. In one embodiment, the diced package is a chip scale package (CSP). The size of the chip scale package may be only slightly larger than the size of the packaged chip. For example, the size of the chip package is not larger than 120% of the size of the packaged chip.

Figure 1A:
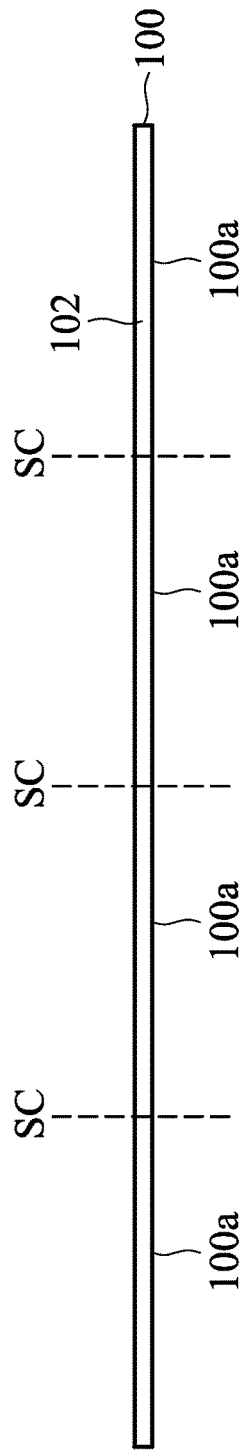
FIGS. 1A-1E are cross-sectional views of a wafer-level packaging process of a chip package according to an embodiment of the invention.

FIGS. 1A-1E are cross-sectional views of a wafer-level packaging process of a chip package according to an embodiment of the invention. As shown in FIG. 1A, a semiconductor substrate 100 is provided. The semiconductor substrate 100 has a surface 100a. The semiconductor substrate 100 is, for example, a semiconductor wafer. Therefore, the symbol 100 may represent a semiconductor wafer. The suitable semiconductor wafer may include a silicon wafer, a silicon-germanium wafer, a gallium arsenide wafer, or the like.

The semiconductor substrate 100 has chips 102. In the embodiments of the present invention, the chips 102 may include active or passive elements, or electronic components with digital or analog circuits, such as opto electronic devices, micro electro mechanical systems (MEMS), micro fluidic systems, and physical sensors for detecting the physical quantity variation of heat, light, or pressure. Particularly, a wafer scale package (WSP) process may be applied to package semiconductor chips such as image sensor devices, light-emitting diodes (LEDs), solar cells, RF circuits, accelerators, gyroscopes, micro actuators, surface acoustic wave devices, pressure sensors, ink printer heads, or power MOSFET modules. In the present embodiment, the chips 102 may be manufactured by any suitable process, such as a wafer-level CMOS process.

Since each of the chips 102 has function circuits, each of the chips 102 has a warpage according to the circuit design. For example, the warpage includes an upward warpage of the chip edge, a downward warpage of the chip edge or other irregular warpage. In general, for dispersing the stress resulted from the warpage of the chips 102, the semiconductor substrate 100 has a warpage shape corresponding to the chips 102. In some embodiments, the chips 102 of the semiconductor substrate 100 are chips with the same function or the same design. Therefore, in top view, each of the chips 102 of the semiconductor substrate 100 is a repeating unit, and the chips 102 are arranged in the semiconductor substrate 100 continuously. That is, as shown in FIG. 1A, the semiconductor substrate 100 with the chips 102 has a surface 100a with a substantial wavy shape. It should be noted that FIG. 1A only shows an embodiment of a downward warpage of the chip edge. However, persons skilled in the art may conjecture that the surface of the semiconductor substrate 100 has a wavy shape when the edges of the chips 102 warp upwardly or irregularly. Furthermore, in one embodiment, a space (not shown) is between the chips 102 to be used as a scribing line SC.

Figure 1B:
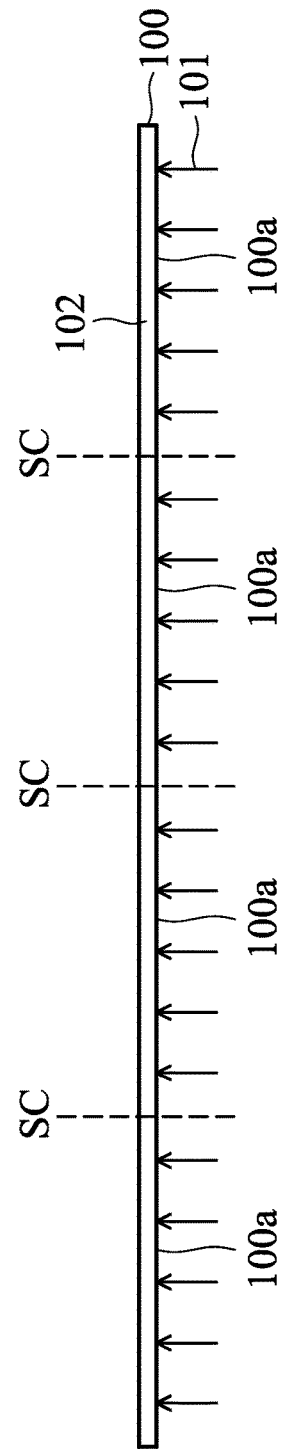

Thereafter, as shown in FIG. 1B, it shows a measurement 101 of circuit distributions on the surface 100a of each of the chips 102. In one embodiment, the measurement 101 may be performed by using a surface scattering instrument or by other measuring methods. It should be noted that the warpage shape and the warpage degree of each of the separated chips 102 formed from dicing the semiconductor substrate 100 is able to be calculated by the measurement of circuit distributions on the surface 100a of each of the chips 102.

Figure 1C:
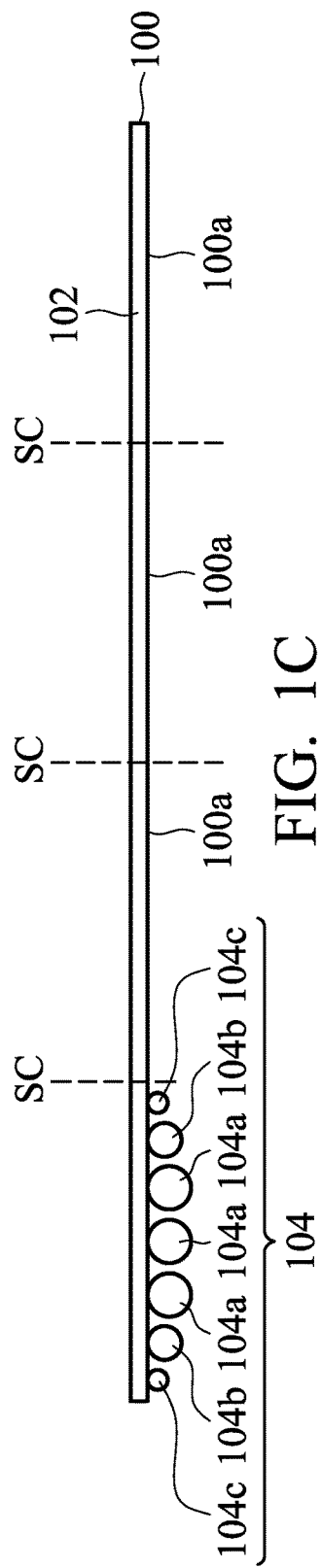

Then, referring to FIG. 1C, according to the calculation result mentioned above, the solder balls 104 are disposed on each of the chips 102 of the semiconductor substrate 100. In one embodiment, the solder balls 104 may at least have a first size and a second size that is different from the first size. The solder balls 104 may have various sizes according to requirements. For example, the solder balls 104 may have a third size different from the first size and the second size or have more sizes. In one embodiment, the sizes of the solder balls 104a of the first size and the solder balls 104b of the second size have a positive relationship or a negative relationship to the warpage degree and the warpage direction of the chips. Alternatively, the solder balls 104 may at least have a first height and a second height that is different from the first height and other heights. For illustration purposes, the different heights are referred as different sizes in the following description. The solder balls 104 may include eutectic solder balls, lead-free solder balls or combinations thereof. For example, in some embodiments, according to the calculation results, the solder balls 104a and 104b are disposed on portions of the chips 102 with a low degree of warpage and portions of the chips 102 with a high degree of warpage, respectively, and vice versa. Therefore, there are the solder balls 104a of the first size and the solder balls 104b of the second size on each of the chips 102. In some embodiments, there are the solder balls 104c with the third size or the solder balls of other size on the chips 102. The number of the solder balls of different sizes may be varied according to the chip warpage degree or the area of the chip, and may be adjusted according to demand.

Figure 2:
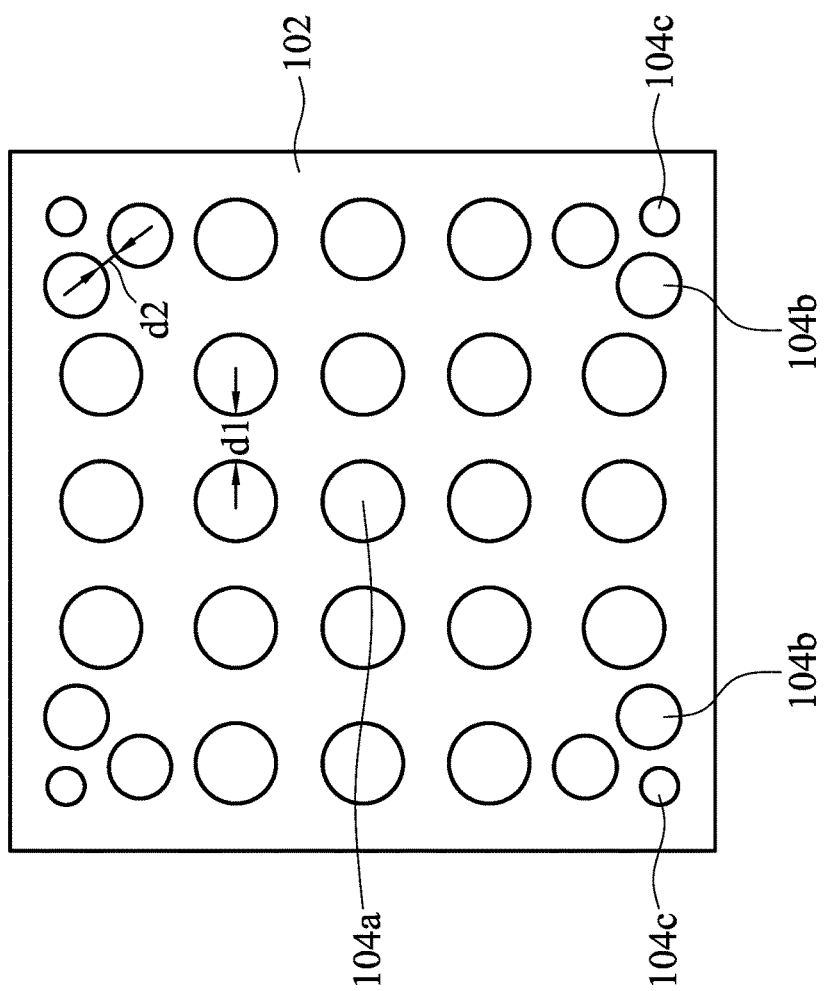
FIG. 2 is a bottom view of chips after being disposed with the solder balls of FIG. 1C.

In some embodiments, the spacing d1 between the adjacent solder balls 104a of the first size is different from the spacing d2 between the adjacent solder balls 104b of the second size. For example, referring to FIG. 2, FIG. 2 is a bottom view of the chips 102 after being disposed with the solder balls 104 (as shown in FIG. 1C). As shown in FIG. 2, the spacing d1 between the adjacent solder balls 104a of the first size is different from the spacing (not shown) between the solder balls 104a and the solder balls 104b of the second size. According to the above descriptions, it is known that the spacings mentioned above are determined according to the warpage degree and the shape of the chips 102 after dicing the semiconductor substrate 100.

For example, FIG. 1C shows the embodiment in which the chip edges warp downwardly. The solder balls 104a of the first size may be disposed adjacent to the center of each of the chips 102. The solder balls 104b of the second size may be disposed adjacent to the edge of each of the chips 102. The solder balls 104c with the third size may be disposed mostly adjacent to the edge of each of the chips 102. In the present embodiment, the first size is larger than the second size, and the second size is larger than the third size.

As shown in FIG. 2, the solder balls 104b of the second size and the solder balls 104c with the third size are disposed adjacent to the corners of the chips 102. Alternatively, in other embodiments, the solder balls 104b of the second size and the solder balls 104c with the third size are arranged in one row or multiple rows concentrically surrounding the solder balls 104a (not shown) disposed adjacent to the center of each of the chips 102.

In the present embodiment, the solder balls 104a of the first size have the main functions of support and signal transmission. The solder balls 104b of the second size, the solder balls 104c with the third size and the solder balls of other sizes may also have the functions of support and electronic signal transmission. Alternatively, in other embodiments, the solder balls 104b of the second size, the solder balls 104c with the third size and the solder balls of other sizes may have the functions of support, stress compensation or heat conduction and are not connected with functional circuits of the chips 102.

Figure 1D:
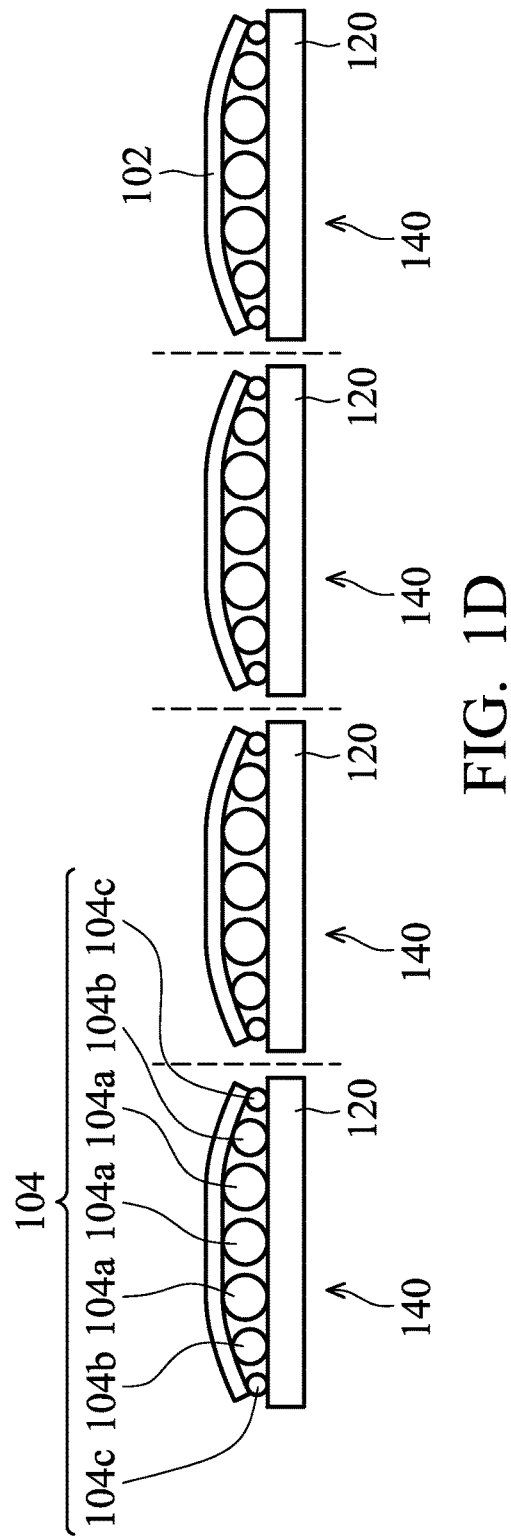

Then, referring to FIG. 1D, the semiconductor substrate 100 is disposed on the packaging substrate 120 via the solder balls 104a, and the semiconductor substrate 100 and the packaging substrate 120 are diced into separated chip packages 140 along the scribing lines SC on the semiconductor substrate 100. The packaging substrate 120 is, for example, a printed circuit board, a silicon substrate with a function of electrical connection, three dimensional (3D) packaging substrate, etc. After the dicing process, the separated chips 102 may warp due to the distribution of the functional circuits of the chips 102. Therefore, the solder balls 104a, 104b and 104c may be in close contact with the packaging substrate 120.

Figure 1E:
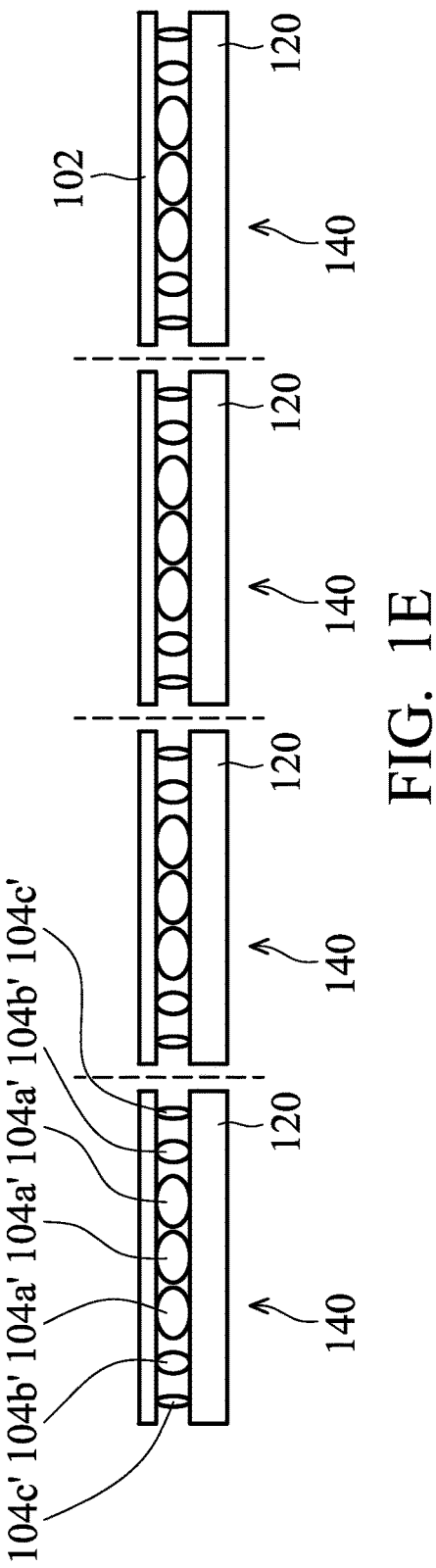

Thereafter, referring to FIG. 1E, a reflow process is performed to the solder balls 104a, 104b and 104c, such that the solder balls 104a, 104b and 104c are deformed into solder balls 104a', 104b' and 104c' by gravity, and therefore the solder balls 104a', 104b' and 104c' are in close contact with the chips 102 and the packaging substrates 120. For example, since the solder balls 104a' adjacent to the center of the chip 102 bear the main weight of the chip 102, the solder balls 104a' are wider and shorter than the unreflowed solder balls 104a. Since the spacing between the chip 102 and the packaging substrate 120 becomes large, the solder balls 104b' and 104c' adjacent to the edge of the chip 102 are taller and more slender than the unreflowed solder balls 104b and 104c.

Therefore, the warpage of the chip 102 may be compensated by adjusting the size and the disposed position of the deformed solder balls 104a', 104b' and 104c' and the spacing between the solder balls 104a', 104b' and 104c'. The solder balls 104a', 104b' and 104c' may be the same height. Furthermore, the solder balls 104a' are wider than the solder balls 104b', and the solder balls 104b' are wider than the solder balls 104c'. Therefore, the issue of warpage of the chip 102 may be reduced or eliminated, and the possibility of breaking the chip 102 is reduced. That is, the surface of the chip 102 is a substantially flat surface.

Therefore, the manufacturing method of the embodiment of FIGS. 1A-1E may improve the yield, and the durability and the performance of the chip packages 140 formed by the manufacturing method are significantly improved.

Figure 3:
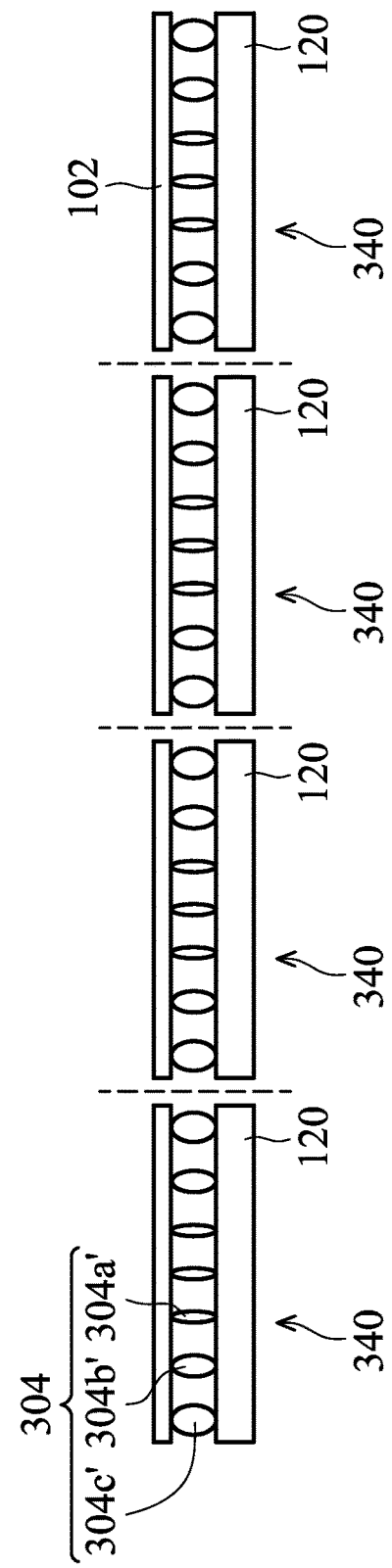
FIG. 3 is a cross-sectional view of a wafer-level packaging process of a chip package according to another embodiment of the invention.

FIG. 3 shows chip packages 340 formed by the manufacturing method of the embodiment of FIGS. 1A-1E. However, the edge of the chip 102 of the chip package 340 bears the main weight of the chip. In the present embodiment and the embodiment mentioned above, same reference numbers are used to designate same or similar elements. Therefore, the materials and the manufacturing methods of the elements with the same reference numbers are provided by referring to the relative description of the embodiment of FIGS. 1A-1E.

In the present embodiment, the solder balls 304a' of the first size may be disposed adjacent to the centers of the chips 102. The solder balls 304b' of the second size may be disposed adjacent to the edges of the chips 102. The solder balls 304c' with the third size may be disposed mostly adjacent to the edge of each of the chips 102. The same as the embodiment mentioned above, the solder balls 304b' of the second size and the solder balls 304c' with the third size may be disposed adjacent to the corners of the chips 102. Alternatively, in other embodiments, the solder balls 304b' of the second size and the solder balls 304c' with the third size are arranged in one row or multiple rows concentrically surrounding the solder balls 304a' (not shown) disposed adjacent to the center of each of the chips 102. In the present embodiments, the solder balls 304a', 304b' and 304c' may have the same height. The widths of the solder balls 304a' are less than the widths of the solder balls 304b', and the widths of the solder balls 304b' are less than the widths of the solder balls 304c'.

Therefore, the warpage of the chip 102 may be compensated by adjusting the size and the disposed position of the deformed solder balls 304a', 304b' and 304c' and the spacing between the solder balls 304a', 304b' and 304c'. Therefore, the issue of warpage of the chip 102 may be reduced or eliminated, and the possibility of breaking the chip 102 is reduced. That is, the surface of the chip 102 is a substantially flat surface. In the present embodiment, the solder balls 304a' of the first size have the main functions of support and signal transmission. The solder balls 304b' of the second size, the solder balls 304c' with the third size and the solder balls of other sizes may also have the functions of support and electronic signal transmission. Alternatively, in other embodiments, the solder balls 304b' of the second size, the solder balls 304c' with the third size and the solder balls of other sizes may have the functions of support, stress compensation or heat conduction and are not connected with functional circuits of the chips 102.

FIGS. 4A-4B are cross-sectional views of a chip-level packaging process of a chip package according to one embodiment of the invention. In the present embodiment and the embodiment mentioned above, same reference numbers are used to designate same or similar elements. Therefore, the materials and the manufacturing methods of the elements with the same reference numbers are provided by referring to the relative description of the embodiment of FIGS. 1A-1E.

As shown in FIG. 4A, the solder balls 104 are disposed on each of the separated chips 102 according to the calculation result. In one embodiment, the solder balls 104 may at least have a first size and a second size that is different from the first size. In one embodiment, the sizes of the solder balls 104a of the first size and the solder balls 104b of the second size have a positive relationship or a negative relationship to the warpage degree and the warpage direction of the chips. Alternatively, the solder balls 104 may have various sizes according to requirements. For example, the solder balls 104 may further have a third size or more sizes. For example, in some embodiments, according to the calculation results, the solder balls 104a and 104b with different sizes are disposed on portions of the chips 102 with a low degree of warpage and portions of the chips 102 with a high degree of warpage, respectively, and vice versa. Therefore, there are the solder balls 104a of the first size and the solder balls 104b of the second size on each of the chips 102. In some embodiments, there are the solder balls 104c with the third size or the solder balls of other size on the chips 102. The number of the solder balls with different sizes may be varied according to the chip warpage degree or the area of the chip, and may be adjusted according to demand.

In some embodiments, the spacing d1 between the adjacent solder balls 104a of the first size is different from the spacing d2 between the adjacent solder balls 104b of the second size. The spacings mentioned above are determined according to the warpage degree and the shape of the chips 102 after dicing the semiconductor substrate 100.

Then, referring to FIG. 4B, the separated chips 102 are bonded onto the corresponding packaging substrate 120 respectively so as to form multiple chip packages 440. Furthermore, a reflow process is performed to the solder balls 104a, 104b and 104c, such that the solder balls 104a, 104b and 104c are deformed into solder balls 104a', 104b' and 104c' by gravity, and therefore the solder balls 104a', 104b' and 104c' are in close contact with the chips 102 and the packaging substrates 120. For example, since the solder balls 104a' adjacent to the center of the chip 102 bear the main weight of the chip 102, the solder balls 104a' are wider and shorter than the unreflowed solder balls 104a. Since the spacing between the chip 102 and the packaging substrate 120 becomes large, the solder balls 104b' and 104c' adjacent to the edge of the chip 102 are taller and more slender than the unreflowed solder balls 104b and 104c. For example, the solder balls 104a' are shorter than the solder balls 104b', and the solder balls 104b' are shorter than the solder balls 104c'. The solder balls 104a' are wider than the solder balls 104b', and the solder balls 104b' are wider than the solder balls 104c'.

Therefore, the warpage of the chip 102 may be compensated by adjusting the size and the disposed position of the deformed solder balls 104a', 104b' and 104c' and the spacing between the solder balls 104a', 104b' and 104c'. For example, the solder balls 104a', 104b' and 104c' may have the same height. The solder balls 104a' are wider than the solder balls 104b', and the solder balls 104b' are wider than the solder balls 104c'. Therefore, the issue of warpage of the chip 102 may be reduced or eliminated, and the possibility of breaking the chip 102 is reduced. That is, the surface of the chip 102 is a substantially flat surface. Therefore, the manufacturing method of the embodiment of FIGS. 1A-1E may improve the yield, and the durability and the performance of the chip packages 440 formed by the manufacturing method are significantly improved.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising: a packaging substrate; a chip; and a plurality of solder balls disposed between the packaging substrate and the chip so as to bond the chip onto the packaging substrate, wherein each of the solder balls has outwardly convex cross-sectional sidewalls, wherein the solder balls have a first size, a second size, and a third size which are different from one another, wherein relative to the solder balls of the first size, the solder balls of the second size are disposed adjacent to a corner of the chip, wherein the solder balls of the third size are disposed adjacent to an outermost edge of the chip, wherein the sizes of the solder balls of the first size and the solder balls of the second size have a relationship to a warpage degree and a warpage direction of the chip which are calculated by measurement of circuit distributions on a surface of the chip, wherein a cross-sectional width of the solder balls of the first size is larger than a cross-sectional width of the solder balls of the second size, and the cross-sectional width of the solder balls of the second size is larger than a cross-sectional width of the solder balls of the third size, wherein all of the plurality of solder balls have substantially the same height, wherein the solder balls of the first size electrically connect the chip to the packaging substrate, and wherein the solder balls of the second size and the solder balls of the third size function as support for stress compensation or heat conduction and do not electrically connect to functional circuits of the chip.

2. The chip package as claimed in claim 1, wherein the relationship is a positive relationship or a negative relationship to the warpage degree and the warpage direction of the chip.

3. The chip package as claimed in claim 1, wherein a spacing between the solder balls of the first size is different from a spacing between the solder balls of the second size.

4. The chip package as claimed in claim 1, wherein a spacing between the solder balls of the first size is different from a spacing between the solder balls of the first size and the solder balls of the second size.

5. The chip package as claimed in claim 1, wherein the chip is formed by dicing a semiconductor substrate, and the semiconductor substrate comprises a silicon wafer, a silicon-germanium wafer, or a gallium arsenide wafer.

6. The chip package as claimed in claim 1, wherein the surface of the chip is a substantially flat surface.

7. The chip package as claimed in claim 1, wherein the solder balls of the third size are disposed furthest away from a center of the chip.

8. The chip package as claimed in claim 1, wherein the solder balls of the third size are disposed at the corner of the chip.

9. A method for fabricating the chip package of claim 1, comprising: forming a plurality of chips on a wafer; measuring a distribution of a circuit of the chips on the wafer; disposing a plurality of solder balls on the chips on the wafer, wherein each of the solder balls has outwardly convex cross-sectional sidewalls, wherein the solder balls on each chip have a first size, a second size, and a third size which are different from one another, wherein relative to the solder balls of the first size, the solder balls of the second size are disposed adjacent to a corner of the chip, wherein the solder balls of the third size are disposed adjacent to an outermost edge of the chip, wherein the sizes of the solder balls of the first size and the solder balls of the second size have a relationship to a warpage degree and a warpage direction of the chip which are calculated by measurement of circuit distributions on a surface of the chips, wherein a cross-sectional width of the solder balls of the first size is larger than a cross-sectional width of the solder balls of the second size, and the cross-sectional width of the solder balls of the second size is larger than a cross-sectional width of the solder balls of the third size, and the solder balls of the first size and the solder balls of the second size are arranged according to the measurement result; bonding the wafer onto a packaging substrate; dicing the wafer to form a plurality of chip packages; and after forming the chip packages, performing a reflow process to the solder balls, wherein all of the plurality of solder balls have substantially the same height, wherein the solder balls of the first size electrically connect the chip to the packaging substrate, and wherein the solder balls of the second size and the solder balls of the third size function as support for stress compensation or heat conduction and do not electrically connect to functional circuits of the chip.

10. The method for fabricating a chip package as claimed in claim 9, wherein the relationship is a positive relationship or a negative relationship to the warpage degree and the warpage direction of the chip.

11. The method for fabricating a chip package as claimed in claim 9, wherein after the reflow process, the solder balls of the first size are wider and shorter than the unreflowed solder balls of the first size, and the solder balls of the second size are taller and more slender than the unreflowed solder balls of the second size.

12. The method for fabricating a chip package as claimed in claim 9, wherein after the reflow process, the solder balls of the first size are taller and more slender than the unreflowed solder balls of the first size, and the solder balls of the second size are wider and shorter than the unreflowed solder balls of the second size.

13. The method for fabricating a chip package as claimed in claim 9, wherein a spacing between the solder balls of the first size is different from a spacing between the solder balls of the second size, and a spacing between the solder balls of the first size is different from a spacing between the solder balls of the first size and the solder balls of the second size.

14. A method for fabricating the chip package of claim 1, comprising: forming a plurality of chips on a wafer; measuring a distribution of circuits of the chips on the wafer; dicing the wafer into a plurality of separated chips; disposing a plurality of solder balls on the separated chips, wherein each of the solder balls has outwardly convex cross-sectional sidewalls, wherein the solder balls on each chip have a first size, a second size, and a third size which are different from one another, wherein relative to the solder balls of the first size, the solder balls of the second size are disposed adjacent to a corner of the chip, wherein the solder balls of the third size are disposed adjacent to an outermost edge of the chip, wherein the sizes of the solder balls of the first size and the solder balls of the second size have a relationship to a warpage degree and a warpage direction of the chip which are calculated by measurement of circuit distributions on a surface of the chip, wherein a cross-sectional width of the solder balls of the first size is larger than a cross-sectional width of the solder balls of the second size, and the cross-sectional width of the solder balls of the second size is larger than a cross-sectional width of the solder balls of the third size, and the solder balls of the first size and the solder balls of the second size are arranged according to the measurement result; bonding the separated chips onto corresponding packaging substrates respectively to form a plurality of chip packages; and after forming the chip packages, performing a reflow process to the solder balls, wherein all of the plurality of solder balls have substantially the same height, wherein the solder balls of the first size electrically connect the chip to the packaging substrate, and wherein the solder balls of the second size and the solder balls of the third size function as support for stress compensation or heat conduction and do not electrically connect to functional circuits of the chip.

15. The method for fabricating a chip package as claimed in claim 14, wherein the relationship is a positive relationship or a negative relationship to the warpage degree and the warpage direction of the chips.

16. The method for fabricating a chip package as claimed in claim 14, wherein after the reflow process, the solder balls of the first size are wider and shorter than the unreflowed solder balls of the first size, and the solder balls of the second size are taller and more slender than the unreflowed solder balls of the second size.

17. The method for fabricating a chip package as claimed in claim 14, wherein after the reflow process, the solder balls of the first size are taller and more slender than the unreflowed solder balls of the first size, and the solder balls of the second size are wider and shorter than the unreflowed solder balls of the second size.

18. The method for fabricating a chip package as claimed in claim 14, wherein a spacing between the solder balls of the first size is different from a spacing between the solder balls of the second size, and a spacing between the solder balls of the first size is different from a spacing between the solder balls of the first size and the solder balls of the second size.

* * * * *